(12) United States Patent
Tang (10) Patent No.: US 10,333,096 B2
(45) Date of Patent: Jun. 25, 2019

(54) OLED DISPLAY UNIT AND METHOD FOR MANUFACTURING THE SAME

(71) Applicant: Wuhan China Star Optoelectronics Technology Co., Ltd., Wuhan, Hubei (CN)

(72) Inventor: Yuejun Tang, Hubei (CN)

(73) Assignee: Wuhan China Star Optoelectronics Technology Co., Ltd., Wuhan (CN)

( * ) Notice: Subject to any disclaimer, the term of this patent is extended or adjusted under 35 U.S.C. 154(b) by 0 days.

(21) Appl. No.: 15/326,588

(22) PCT Filed: Dec. 29, 2016

(86) PCT No.: PCT/CN2016/113153
§ 371 (c)(1),
(2) Date: Oct. 17, 2017

(87) PCT Pub. No.: WO2018/119926
PCT Pub. Date: Jul. 5, 2018

(65) Prior Publication Data
US 2018/0342694 A1 Nov. 29, 2018

(30) Foreign Application Priority Data
Dec. 27, 2016 (CN) .......................... 2016 1 1228487

(51) Int. Cl.
*H01L 51/52* (2006.01)
*H01L 27/32* (2006.01)
*H01L 51/56* (2006.01)

(52) U.S. Cl.
CPC ...... *H01L 51/5221* (2013.01); *H01L 27/3246* (2013.01); *H01L 27/3276* (2013.01);
(Continued)

(58) Field of Classification Search
CPC ............ H01L 51/5221; H01L 51/5228; H01L 27/3279; H01L 51/56; H01L 27/3246; H01L 27/3276
See application file for complete search history.

(56) References Cited

U.S. PATENT DOCUMENTS

| 2014/0151652 A1 | 6/2014 | Im et al. | |
| 2014/0312323 A1* | 10/2014 | Park | H01L 51/525 |
| | | | 257/40 |

(Continued)

FOREIGN PATENT DOCUMENTS

| CN | 1692679 A | 11/2005 |
| CN | 103219469 A | 7/2013 |

(Continued)

OTHER PUBLICATIONS

Chinese Office Action and Search Report for Chinese Patent Application No. 201611228487.4, dated Jul. 17, 2018.
(Continued)

*Primary Examiner* — Mohammed R Alam (57) ABSTRACT

Disclosed are an OLED display unit and a method for manufacturing the same. The OLED display unit includes a first electrode, a light emitting material layer, a second electrode, and an auxiliary electrode. The auxiliary electrode is provided below the second electrode, and is formed prior to the light emitting material layer. The auxiliary electrode is connected with the second electrode to reduce impedance of the second electrode. When the OLED display unit is used, a voltage drop resulted from a wire resistance of a cathode in a large sized display device can be reduced or eliminated, and increased power consumption caused by uneven light emission can be avoided.

3 Claims, 5 Drawing Sheets

(52) U.S. Cl.
CPC ...... *H01L 27/3279* (2013.01); *H01L 51/5228* (2013.01); *H01L 51/56* (2013.01)

(56) References Cited

U.S. PATENT DOCUMENTS

| | | |
|---|---|---|
| 2014/0346465 A1 | 11/2014 | Kim |
| 2016/0149155 A1* | 5/2016 | Kim .................... H01L 51/5228 257/40 |

FOREIGN PATENT DOCUMENTS

| | | |
|---|---|---|
| CN | 103715205 A | 4/2014 |
| CN | 104124259 A | 10/2014 |
| CN | 104393188 A | 3/2015 |
| CN | 104867955 A | 8/2015 |
| CN | 104934461 A | 9/2015 |
| CN | 105470178 A | 4/2016 |
| CN | 105470278 A | 4/2016 |
| CN | 106206645 A | 12/2016 |

OTHER PUBLICATIONS

Search Report and Written Opinion, dated Jul. 11, 2017, for International Application No. PCT/CN2016/113153.
Office Action and Search Report, dated Jan. 2, 2018, for Chinese Patent Application No. 201611228487.4.

\* cited by examiner

OLED DISPLAY UNIT AND METHOD FOR MANUFACTURING THE SAME

CROSS-REFERENCE TO RELATED APPLICATIONS

The present application claims the priority of Chinese patent application CN 201611228487.4, entitled "OLED display unit and method for manufacturing the same" and filed on Dec. 27, 2016, the entirety of which is incorporated herein by reference.

FIELD OF THE INVENTION

The present disclosure belongs to the technical field of display, and in particular, to an OLED display unit and a method for manufacturing the same.

BACKGROUND OF THE INVENTION

Since an organic light emitting diode (OLED) display device has advantages of light weight, foldability, wide viewing angle, low cost, and the like, it has been more and more widely used.

Figure 1:
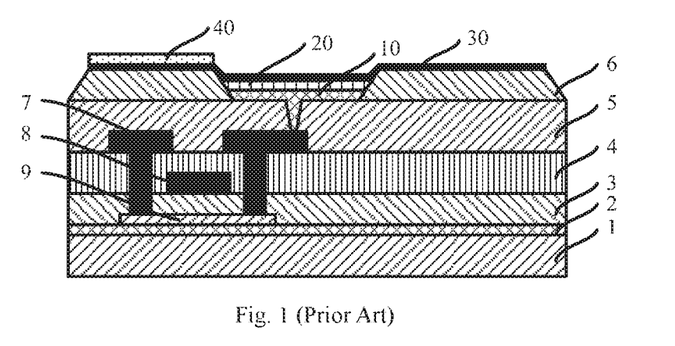
FIG. 1 schematically shows a structure of a common top emitting type OLED display unit in the prior art.

FIG. 1 schematically shows a structure of a conventional top emitting type OLED display unit in the prior art. As shown in FIG. 1, the OLED display unit includes a first electrode 10 provided on a substrate 1. The first electrode 10 is an anode and is a reflective electrode. The first electrode 10 is used as a pixel electrode in the display device, and is made of a conductive metal with a high work function. The OLED display unit further includes a second electrode 30 arranged on a light emitting material layer 20. The second electrode 30 is a cathode and is made of a conductive metal with a low work function. Unlike an anode electrode, the formation of a cathode electrode requires the application of a common voltage to a pixel unit. Therefore, in order to facilitate the application of the common voltage to all pixel units, the structure of cathode electrodes is in the form of a common electrode connected as a whole for all of the pixel units.

An auxiliary electrode 40 is further formed on the cathode. This is because, in a large sized display device, an increased wire resistance of the cathode covering all pixel electrodes (anode) generates a voltage drop, which results in uneven light emission of the respective pixel units and an increased power consumption of the display panel, and the voltage drop of pixel electrodes can be prevented by providing the auxiliary electrode 40.

A main problem in the structure of the above-mentioned light emitting display unit is that the auxiliary electrode 40 is formed after the light emitting material layer 20, and thus the production of the auxiliary electrode 40 may lead to certain damaging and aging effects on the light emitting material layer 20, thereby reducing the luminous efficiency and lifetime of the display device. At the same time, in order to protect the second electrode on the light emitting material, it is necessary to form an auxiliary protective layer at the position where the auxiliary electrode is not provided before the auxiliary electrode is formed, and the auxiliary protective layer protects the second electrode from being damaged while the auxiliary electrode is being produced. However, this procedure is complicated and the contact between the auxiliary protective layer and the auxiliary electrode is not tight enough.

In a word, there is a need to improve the structure of the existing OLED display unit to solve the above problems.

SUMMARY OF THE INVENTION

One of the technical problems to be solved by the present disclosure is to improve a structure of an existing OLED display unit so as to avoid damaging and aging effects on a light emitting material layer due to production of an auxiliary electrode.

In order to solve the above problem, an embodiment of the present application firstly provides an OLED display unit, which comprises: a first electrode, provided on a planar layer near a substrate, made of a conductive metal with a high work function, the first electrode being a reflective electrode; a light emitting material layer, provided on the first electrode, emitting light under an applied electric field to form an image display; a second electrode, provided on the light emitting material layer, made of a conductive metal with a low work function, the second electrodes of respective display units are connected with each other when constituting the display device; an auxiliary electrode, provided below the second electrode, formed prior to the light emitting material layer, and connected with the second electrode to reduce impedance of the second electrode.

Preferably, a thin film transistor array and a data line are further arranged between the substrate and the planar layer. The auxiliary electrode is provided in a same layer as a source and/or a drain of a thin film transistor, and the auxiliary electrode is a bar-shaped electrode, long sides of which are parallel to the data line. The second electrode is connected with the auxiliary electrode through a via hole.

Preferably, a thin film transistor array and a scanning line are further arranged between the substrate and the planar layer. The auxiliary electrode is provided in a same layer as a gate of a thin film transistor, and the auxiliary electrode is a bar-shaped electrode, long sides of which are parallel to the scanning line. The second electrode is connected with the auxiliary electrode through a via hole.

Preferably, a thin film transistor array and a scanning line are further arranged between the substrate and the planar layer. The auxiliary electrode is provided in a same layer as a gate of a thin film transistor, and the auxiliary electrode is a bar-shaped electrode, long sides of which are parallel to the scanning line. An island-like connection electrode is provided at a position corresponding to the auxiliary electrode and in a same layer as a source/a drain of the thin film transistor, and the second electrode is connected with the connection electrode and the auxiliary electrode through a via hole.

Preferably, a thin film transistor array, a data line and a scanning line are further arranged between the substrate and the planar layer. The auxiliary electrode includes a first auxiliary electrode and a second auxiliary electrode. The first auxiliary electrode is provided in a same layer as a gate of a thin film transistor, and the second auxiliary electrode is provided in a same layer as a source and/or a drain of the thin film transistor. The first auxiliary electrode and the second auxiliary electrode both are bar-shaped electrodes, wherein long sides of the first auxiliary electrode are parallel to the scanning line and long sides of the second auxiliary electrode are parallel to the data line. The second electrode is connected with the first auxiliary electrode and the second auxiliary electrode through a via hole.

Preferably, auxiliary electrodes arranged in a direction parallel to the data line and/or auxiliary electrodes arranged in a direction parallel to the scanning line are connected with each other and receive a same voltage signal as the second electrode.

Preferably, the auxiliary electrode is provided in a same layer as the first electrode, and the second electrode is connected with the auxiliary electrode through a via hole.

Preferably, a pixel defining layer is further provided on the planar layer, an accommodating portion is formed on the pixel defining layer, and the auxiliary electrode is deposited in the accommodating portion.

An embodiment of the present application also provides a method for manufacturing an OLED display unit. The method comprises steps of: forming a first electrode on a planar layer near a substrate; forming a pixel defining layer on the first electrode; forming an accommodating portion on the pixel defining layer using a gray-tone mask; depositing an auxiliary electrode in the accommodating portion; forming a light emitting material layer on the first electrode; and forming a second electrode on the auxiliary electrode and the light emitting material layer.

Preferably, the auxiliary electrode is formed by a deposition method using a deposition mask having a fine pattern.

Compared with the prior art, one embodiment or more embodiments described above can have the following advantages or beneficial effects.

By providing the auxiliary electrode on other film layer below the second electrode and forming the auxiliary electrode prior to the light emitting material layer, a voltage drop resulting from a wire resistance of a cathode in a large sized display device can be reduced or eliminated, and an increased power consumption caused by uneven light emission can be avoided. In addition, damaging or aging effects on the light emitting material layer can be prevented.

Other advantages, objects and features of the present disclosure will be further explained to some extent in the following description, and to some extent, it will be apparent to those skilled in the art based on the study of the following, or teachings may be acquired from the practice of the present disclosure. The objects and other advantages of the present disclosure will be realized and achieved through the structure specifically pointed out in the description, claims, and the accompanying drawings.

BRIEF DESCRIPTION OF THE DRAWINGS

The drawings are provided for further understanding of the technical solution of the present application or the prior art, and constitute one part of the description. The accompanying drawings, which illustrate the embodiments of the present application, are used in combination with the embodiments of the present application to explain the technical solutions of the present application, without limiting the technical solutions thereof.

DETAILED DESCRIPTION OF THE EMBODIMENTS

The embodiments of the present disclosure will be described below in detail in connection with the accompanying drawings and embodiments, thereby that how the technical means can be applied to solve the technical problems and the implementation process of achieving the corresponding technical effects in the present disclosure can be fully understood and implemented. The embodiments and various features of the embodiments of the present application can be combined with each other without conflict, and all of the resulting technical solutions are within the scope of protection of the present disclosure.

An OLED display unit proposed in the embodiments of the present disclosure mainly includes a first electrode, a light emitting material layer, a second electrode, and an auxiliary electrode.

Structures of the first electrode, the light emitting material layer, and the second electrode, and positional relationships among the first electrode, the light emitting material layer, and the second electrode are the same as those of an OLED display unit commonly used in the prior art. That is, the first electrode is provided on a planar layer near a substrate and is made of a conductive metal with a high work function. The first electrode is a reflective electrode. The light emitting material layer is provided on the first electrode and emits light under an applied electric field to form an image display. The second electrode is provided on the light emitting material layer and is made of a conductive metal with a low work function, as shown in FIG. 1. The second electrodes of each display unit are connected with each other to form an integral structure when constituting a display device.

In the embodiments of the present disclosure, the auxiliary electrode is provided below the second electrode. The auxiliary electrode is formed prior to the light emitting material layer, and is connected with the second electrode so as to reduce the impedance of the second electrode.

Since the production of the auxiliary electrode is carried out prior to the light emitting material layer, there is no damaging or aging effects on the light emitting material layer, which will be described in detail below in connection with specific embodiments.

Embodiment 1

Figure 2:
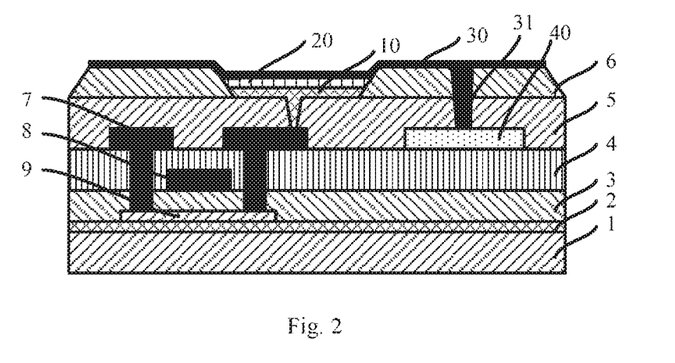
FIG. 2 schematically shows a structure of an OLED display unit according to embodiment 1 of the present disclosure.

FIG. 2 schematically shows a structure of an OLED display unit according to embodiment 1 of the present disclosure. As shown in FIG. 2, in the OLED display unit, a buffer layer 2 and a planar layer 5 are provided on a substrate 1, and a thin film transistor structure is provided between the substrate 1 (actually the buffer layer 2 on the substrate 1) and the planar layer 5.

Specifically, the thin film transistor structure comprises a semiconductor active layer 9, a gate insulating layer (GI layer) 3, a first metal layer (a gate of the thin film transistor) 8, an interlayer insulating layer 4, and a second metal layer (a source/a drain of the thin film transistor) 7. As shown in FIG. 2, the gate 8 of the thin film transistor and the source/drain 7 thereof are insulated from each other by the interlayer insulating layer 4. The planar layer 5 is provided on the source/drain 7 of the thin film transistor, and the source or drain of the thin film transistor is connected to a first electrode (anode) 10 through a via hole in the planar layer 5.

The OLED display units in the present embodiment can be arranged in a matrix form to constitute an OLED display device so as to realize image display thereon. At the same time, in order to transmit a voltage signal to the first electrode 10 (anode, pixel electrode) of each of the OLED display units, the drain or source 7 of the thin film transistor is also connected with a data line after the transistor is turned on, and the data lines each are arranged parallel to each other along a column direction of the display unit matrix in a layer the same as the source and/or drain 7. The gate 8 of the thin film transistor is connected with a scanning line, and the scanning lines each are arranged parallel to each other along a row direction of the display unit matrix in a layer the same as the gate 8.

It should be noted that, the above description is only for explaining the embodiment of the present disclosure. The thin film transistor structure and the positional relationship among film layers included in the thin film transistor structure are not limited to this, and they are not defined in this embodiment.

In the present embodiment, an auxiliary electrode 40 is provided in a same layer as the source and/or drain 7 of the thin film transistor. Specifically, as shown in FIG. 2, the auxiliary electrode 40 is provided on the interlayer insulating layer 4, and is connected with a second electrode 30 through a first via hole 31 in the planar layer 5 and a pixel defining layer 6.

Preferably, via holes in the planar layer 5 and the pixel defining layer 6 are formed in a same procedure. For example, when the pixel defining layer is formed through patterning, via holes are formed in a same position in the planar layer and the pixel defining layer at the same time. A thickness of the planar layer and a thickness of the pixel defining layer are preferably in a range from 0.5 to 3 μm respectively. For example, the thickness of the planar layer is 1.2 μm, and the thickness of the pixel defining layer is 1.2 μm. The planar layer and the pixel defining layer both are preferably made of an organic material or an inorganic material, and more preferably, they are made of a same material. The materials include, but are not limited to, silicon oxide (SiO2), silicon nitride (SiNx) and silicon oxynitride in inorganic materials; and acrylic organic compounds, polyimide or polyimide organic insulating materials in organic materials.

Further, the auxiliary electrode 40 is a bar-shaped electrode having a cuboid shape, and long sides thereof are parallel to the data line.

The auxiliary electrode 40 and the source and/or drain 7 of the thin film transistor are made of a same material. The source/drain 7 generally has a larger thickness and a lower impedance relative to the second electrode 30. Therefore, the auxiliary electrode 40 in the present embodiment can reduce or eliminate a voltage drop resulted from a wire resistance of the second electrode 30 in a large sized display device, and avoid uneven light emission and increased power consumption caused by increased resistance.

The auxiliary electrode 40 can be formed in a same procedure as the source and/or drain 7 of the thin film transistor. The auxiliary electrode 40 is arranged below the planar layer 5, and is formed prior to the second electrode 30. In this manner, it is unnecessary to form an auxiliary protective layer to protect the second electrode 30 when the auxiliary electrode is formed on the second electrode 30, thereby simplifying the production procedure.

The auxiliary electrode 40 is formed prior to the light emitting material layer 20, and thus damaging or aging effects on the light emitting material layer 20 can be avoided.

Embodiment 2

Figure 3:
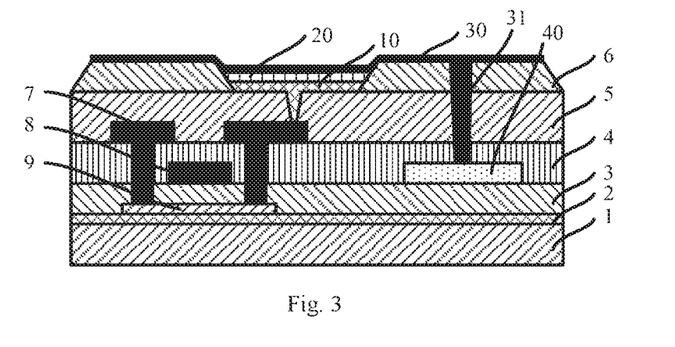
FIG. 3 schematically shows a structure of an OLED display unit according to embodiment 2 of the present disclosure.

FIG. 3 schematically shows a structure of an OLED display unit according to embodiment 2 of the present disclosure. As to structures which are the same as those in embodiment 1, reference can be made to embodiment 1, and they will not be repeated here.

As shown in FIG. 3, in the present embodiment, an auxiliary electrode 40 is provided in a same layer as a gate S of a thin film transistor. Specifically, as shown in FIG. 3, the auxiliary electrode 40 is provided on a gate insulating layer 3, and is connected with a second electrode 30 through a first via hole 31 in an interlayer insulating layer 4, a planar layer 5, and a pixel defining layer 6.

Further, the auxiliary electrode 40 is a bar-shaped electrode having a cuboid shape and long sides thereof are parallel to the scanning line.

The auxiliary electrode 40 and the gate 8 of the thin film transistor are made of a same material. The gate 8 generally has a larger thickness and lower impedance relative to the second electrode 30. Therefore, the auxiliary electrode 40 in the present embodiment can reduce or eliminate a voltage drop resulted from a wire resistance of the second electrode 30 in a large sized display device, and avoid uneven light emission and increased power consumption caused by increased resistance.

The auxiliary electrode 40 can be formed in a same procedure as the gate 8 of the thin film transistor. The auxiliary electrode 40 is arranged below the planar layer 5, and is formed prior to the second electrode 30. In this manner, it is unnecessary to form an auxiliary protective layer to protect the second electrode 30 when the auxiliary electrode is formed, thereby simplifying the production procedure.

The auxiliary electrode 40 is formed prior to the light emitting material layer 20, and thus damaging or aging effects on the light emitting material layer 20 can be avoided.

Embodiment 3

Figure 4:
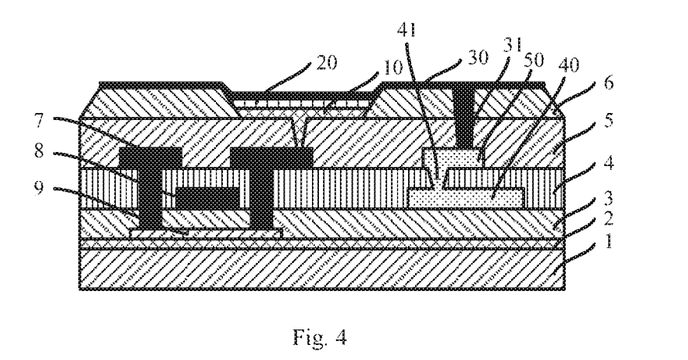
FIG. 4 schematically shows a structure of an OLED display unit according to embodiment 3 of the present disclosure.

FIG. 4 schematically shows a structure of an OLED display unit according to embodiment 3 of the present disclosure. As to structures which are the same as those in embodiment 1, reference can be made to embodiment 1, and they will not be repeated here.

As shown in FIG. 4, in the present embodiment, an auxiliary electrode 40 is provided in a same layer as a gate 8 of a thin film transistor. Specifically, as shown in FIG. 4, the auxiliary electrode 40 is provided on the gate insulating layer 3.

The auxiliary electrode 40 is a bar-shaped electrode having a cuboid shape and long sides thereof are parallel to the scanning line.

Further, an island-like connection electrode 50 is provided in a same layer as the source and/or drain 7 of the thin film transistor on an interlayer insulating layer 4. The island-like connection electrode 50 can be a circular shaped electrode or a square shaped electrode, and serves to connect an upper side electrode with a lower side electrode. The connection electrode 50 and the auxiliary electrode 40 are connected with each other through a second via hole 41 in the interlayer insulating layer 4, and the connection electrode 50 and a second electrode 30 are connected with each other through a first via hole 31 in a planar layer 5 and a pixel defining layer 6. Therefore, the auxiliary electrode 40 and the second electrode 30 are connected with each other through the first via hole 31/the second via hole 41/the connection electrode 50.

Preferably, the via hole in the planar layer 5 and the via hole in the pixel defining layer 6 are formed in a same procedure, and reference can be made to embodiment 1 for specific content.

The auxiliary electrode 40 and a gate 8 of the thin film transistor are made of a same material, and the connection electrode 50 and the source and/or drain 7 of the thin film transistor are made of a same material. The auxiliary electrode 40 and the connection electrode 50 which are connected with each other in the embodiment can reduce or eliminate a voltage drop resulted from a wire resistance of the second electrode 30 in a large sized display device, and avoid uneven light emission and increased power consumption caused by increased resistance.

The auxiliary electrode 40 can be formed in a same procedure as the gate 8 of the thin film transistor, and the connection electrode 50 can be formed in a same procedure as the source and/or drain 7 of the thin film transistor. Both the auxiliary electrode 40 and the connection electrode 50 are arranged below the planar layer 5, and are formed prior to the second electrode 30. In this manner, it is unnecessary to form an auxiliary protective layer to protect the second electrode 30 when the auxiliary electrode and the connection electrode are formed, thereby simplifying the production procedure.

The auxiliary electrode 40 and the connection electrode 50 are formed prior to the light emitting material layer 20, and thus damaging or aging effects on the light emitting material layer 20 can be avoided.

Embodiment 4

Figure 5:
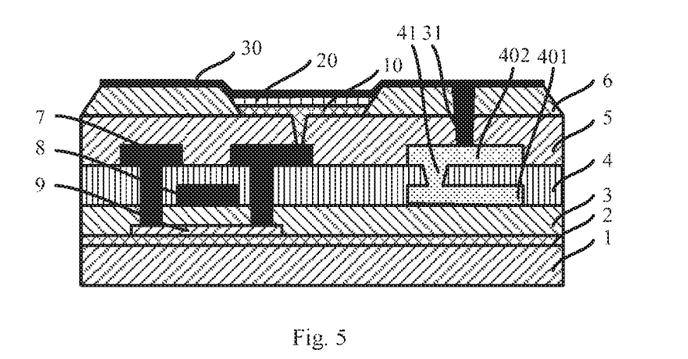
FIG. 5 schematically shows a structure of an OLED display unit according to embodiment 4 of the present disclosure.

FIG. 5 schematically shows a structure of an OLED display unit according to embodiment 4 of the present disclosure. As to structures which are the same as those in embodiment 1, reference can be made to embodiment 1, and they will not be repeated here.

As shown in FIG. 5, in the present embodiment, an auxiliary electrode 40 is further divided into a first auxiliary electrode 401 and a second auxiliary electrode 402, wherein the first auxiliary electrode 401 is provided in a same layer as a gate 8 of a thin film transistor, and the second auxiliary electrode 402 is provided in a same layer as a source and/or drain 7 of the thin film transistor.

The first auxiliary electrode 401 and the second auxiliary electrode 402 both are bar-shaped electrodes having a cuboid shape. Long sides of the first auxiliary electrode 401 are parallel to the scanning line, and long sides of the second auxiliary electrode 402 are parallel to the data line.

Further, the first auxiliary electrode 401 and the second auxiliary electrode 402 are connected with each other through a second via hole 41 in an interlayer insulating layer 4, and the second auxiliary electrode 402 and the second electrode 30 are connected with each other through a first via hole 31 in a planar layer 5 and a pixel defining layer 6.

Preferably, the via hole in the planar layer 5 and the via hole in the pixel defining layer 6 are formed in a same procedure, and reference can be made to embodiment 1 for specific content.

The first auxiliary electrode 401 and the gate 8 of the thin film transistor are made of a same material, and the second auxiliary electrode 402 and the source and/or drain 7 of the thin film transistor are made of a same material. The first auxiliary electrode 401 and the second auxiliary electrode 402 which are connected with each other in this embodiment can reduce or eliminate a voltage drop resulted from a wire resistance of the second electrode 30 in a large sized display device, and avoid uneven light emission and increased power consumption caused by increased resistance.

The first auxiliary electrode 401 can be formed in a same procedure as the gate 8 of the thin film transistor, and the second auxiliary electrode 402 can be formed in a same procedure as the source and/or drain 7 of the thin film transistor. Both the first auxiliary electrode 401 and the second auxiliary electrode 402 are arranged below the planar layer 5, and are formed prior to the second electrode 30. In this manner, it is unnecessary to form an auxiliary protective layer to protect the second electrode 30 when the first auxiliary electrode and the second auxiliary electrode are formed, thereby simplifying the production procedure.

The first auxiliary electrode 401 and the second auxiliary electrode 402 are formed prior to the light emitting material layer 20, and thus damaging or aging effects on the light emitting material layer 20 can be avoided.

Embodiment 5

Figure 6:
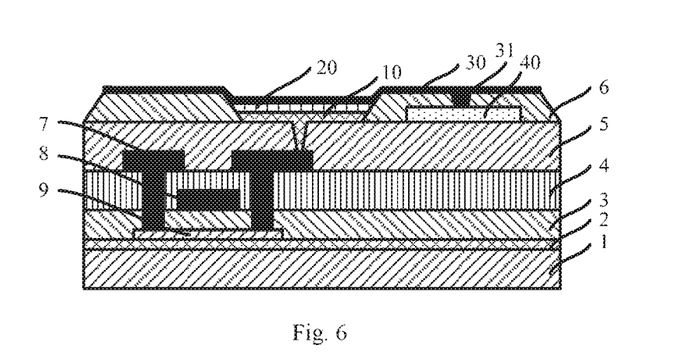
FIG. 6 schematically shows a structure of an OLED display unit according to embodiment 5 of the present disclosure.

FIG. 6 schematically shows a structure of an OLED display unit according to embodiment 5 of the present disclosure. As to structures which are the same as those in embodiment 1, reference can be made to embodiment 1, and they will not be repeated here.

As shown in FIG. 6, in the present embodiment, an auxiliary electrode 40 is provided in a same layer as a first electrode 10. Specifically, as shown in FIG. 6, the auxiliary electrode 40 is provided on a planar layer 5, and the auxiliary electrode 40 and a second electrode 30 are connected with each other through a first via hole 31 in a pixel defining layer 6. The auxiliary electrode 40 and the first electrode 10 can be made of a same material, and the auxiliary electrode 40 can be formed in a same procedure as the first electrode 10. The auxiliary electrode 40 and the first electrode 10 can be made of different materials, and the auxiliary electrode 40 can be formed prior to or subsequent to the first electrode 10.

The auxiliary electrode 40 can be a bar-shaped electrode having a cuboid shape. Long sides of the auxiliary electrode 40 are parallel to the scanning line, or long sides thereof are parallel to the data line. The auxiliary electrode 40 can also be a multi-crossed shape. That is, the auxiliary electrode 40 is formed by a plurality of cuboid electrodes in a crossed manner, with long sides of part of the cuboid electrodes being parallel to the scanning line, and long side of the other part thereof being parallel to the data line. The shape of the auxiliary electrode of this embodiment is not limited to this, and can be a shape in which the auxiliary electrodes in different pixels are connected with each other.

The auxiliary electrode 40 in the present embodiment can reduce or eliminate a voltage drop resulted from a wire resistance of the second electrode 30 in a large sized display device, and avoid uneven light emission and increased power consumption caused by increased resistance. The auxiliary electrode 40 is formed prior to the second electrode 30 and a light emitting material layer 20, and thus it is unnecessary to form an auxiliary protective layer to protect the second electrode 30 when the auxiliary electrode is formed. In this manner, the production procedure can be simplified, and damaging or aging effects on the light emitting material layer 20 can be avoided.

Embodiment 6

The present embodiment proposes a signal supply method for the MED display unit provided with the bar-shaped auxiliary electrode in embodiment 1, embodiment 2, embodiment 3, and embodiment 4.

Specifically, the auxiliary electrodes arranged in a direction parallel to the data line are connected with each other, or the auxiliary electrodes arranged in a direction parallel to the scanning line are connected with each other, or the auxiliary electrodes arranged in the direction parallel to the data line are connected with the auxiliary electrodes arranged in the direction parallel to the scanning line, and the same voltage signal as the second electrode 30 is received by the integrated electrode formed after connection.

In the embodiments of the present disclosure, it can be achieved that cathode signals in units in a form of a row and/or a column do not generate a voltage drop or reduce the generation of a voltage drop by merely communicating the auxiliary electrodes in each pixel in the row and/or the column on a unit in the form of the column (the first embodiment) or a unit in the form of the row (the second embodiment and the third embodiment) or a unit in the form of the row and the column (the fourth embodiment) in an active region and introducing signals through the second electrode (cathode).

In the embodiments of the present disclosure, the auxiliary electrodes between units in a form of a row and/or a column can further be integrally connected in a non-active region and connected to a signal input terminal. It can be achieved that cathode signals in the units in the form of the row and/or the column do not generate a voltage drop or reduce the generation of a voltage drop by introducing cathode signals through the cathodes and the auxiliary electrodes.

Embodiment 7

Figure 7A:
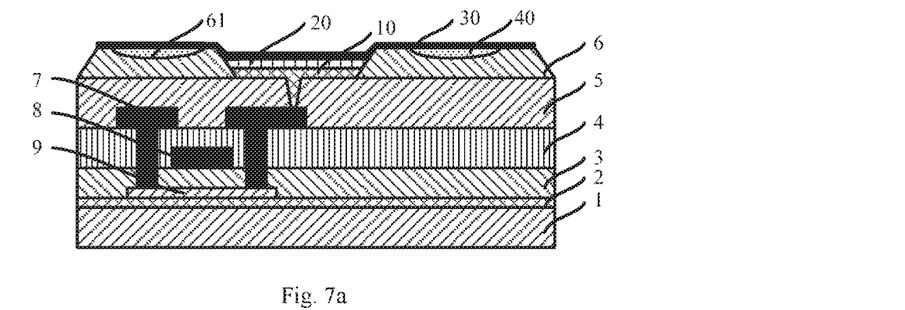
FIGS. 7a and 7b schematically show structures of an OLED display unit according to embodiment 7 of the present disclosure.
Figure 7B:
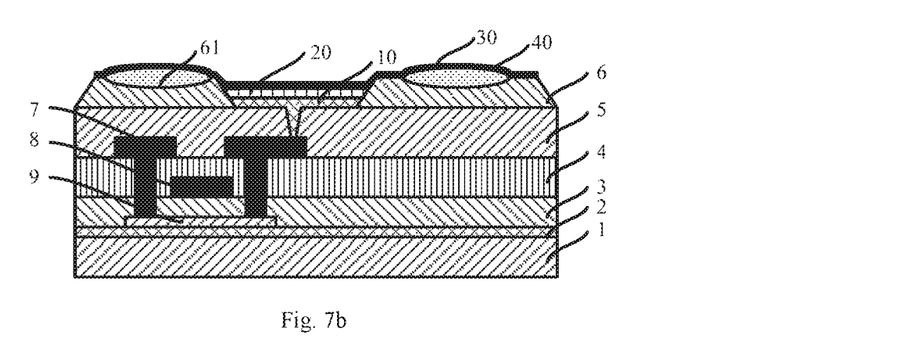

FIGS. 7a and 7b schematically show structures of an OLED display unit according to embodiment 7 of the present disclosure. As to structures which are the same as those in embodiment 1, reference can be made to embodiment 1, and they will not be repeated here.

As shown in FIG. 7a, in the present embodiment, an accommodating portion 61 is formed on a pixel defining layer 6, and an auxiliary electrode 40 is deposited in the accommodating portion 61.

In FIG. 7a, the auxiliary electrode 40 does not extend beyond an upper surface of the pixel defining layer 6, so that an upper surface of the second electrode 30 deposited thereafter can have a planar surface, which facilitates manufacturing of a barrier layer, a film packaging procedure, and the like in the following.

In FIG. 7b, an auxiliary electrode 40 extends beyond an upper surface of an accommodating portion 61 and a pixel defining layer 6. Since a thickness of the auxiliary electrode 40 is larger, a voltage drop resulted from a wire resistance of a second electrode 30 in a large sized display device can be reduced or eliminated more effectively, and uneven light emission and increased power consumption caused by increased resistance can be avoided.

In practice, different structural auxiliary electrodes can be selected according to the needs of the product and process.

In the embodiment of the present disclosure, the auxiliary electrode 40 is formed prior to the second electrode 30 and a light emitting material layer 20, which will be further illustrated below in connection with embodiment 8.

Embodiment 8

Figure 8:
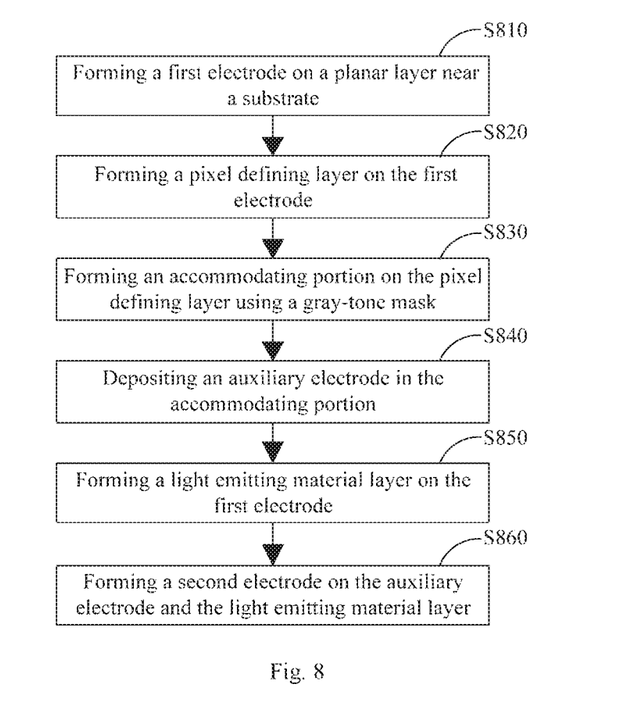
FIG. 8 is a flow chart of a method for manufacturing the OLED display unit as shown in FIGS. 7a and 7b according to embodiment 8 of the present disclosure.

The present embodiment proposes a method for manufacturing the OLED display unit in embodiment 7, and FIG. 8 is a flow chart of the method. As shown in FIG. 8, the method comprises following steps.

In step S810, a first electrode 10 is formed on a planar layer 5 near a substrate 1. Specifically, a thin film transistor structure, a capacitor, a circuit thereof, and the like are formed on the substrate 1 before the first electrode 10 is formed.

Figure 9A:
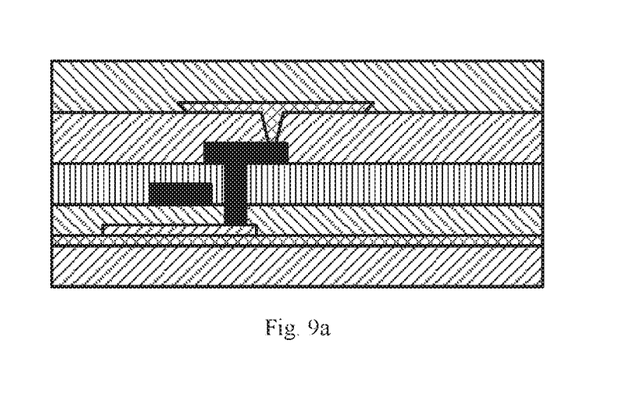
FIGS. 9a-9e schematically show steps of manufacturing the OLED display unit as shown in FIGS. 7a and 7b according to embodiment 8 of the present disclosure.

In step S820, a pixel defining layer 6 is formed on the first electrode 10, as shown in FIG. 9a.

Figure 9B:
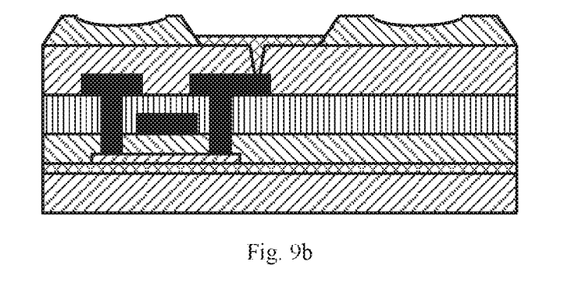

In step S830, an accommodating portion 61 is formed on the pixel defining layer 6 by a gray-tone mask, as shown in FIG. 9b. Specifically, a light emitting material accommodating portion and an auxiliary electrode accommodating portion are simultaneously formed on the pixel defining layer 6 by the gray-tone mask.

Figure 9C:
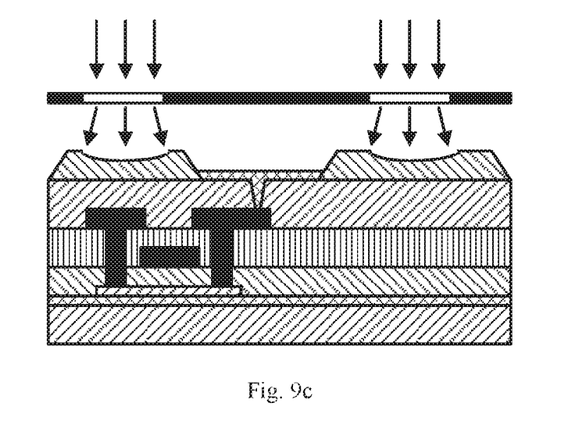
Figure 9D:
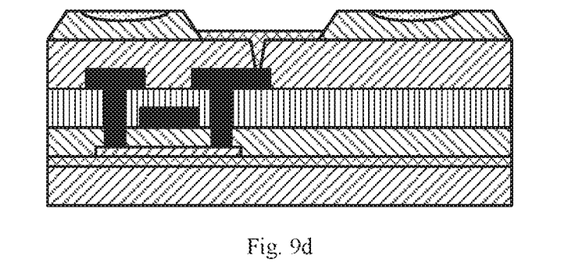
Figure 9E:
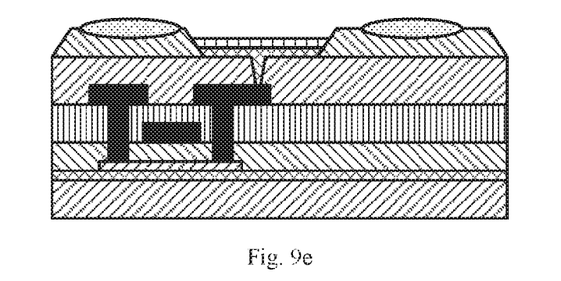

In step S840, an auxiliary electrode 40 is deposited in the accommodating portion 61, as shown in FIG. 9c. Specifically, the auxiliary electrode 40 is formed by a deposition method using a deposition mask having a fine pattern, as shown in FIG. 9d or FIG. 9e. The auxiliary electrode 40 can be made of one of Mg, Al, Ag or an alloy thereof, or the auxiliary electrode 40 can be made of a same material as the second electrode 30.

In step S850, a light emitting material layer 20 is formed on the first electrode 10.

In step S860, a second electrode 30 is formed on the auxiliary electrode 40 and the light emitting material layer 20.

In the present embodiment, the accommodating portion is formed by the gray-tone mask when the pixel defining layer is being produced. The auxiliary electrode is firstly formed by a deposition method using a deposition mask having a fine pattern in the accommodating portion, and the second electrode is formed after the auxiliary electrode is formed. Therefore, the production of the auxiliary electrode will not cause damaging or aging effects on the light emitting material layer. The auxiliary electrode is formed prior to the second electrode, and thus it is unnecessary to form an auxiliary protective layer to protect the second electrode, thereby simplifying the manufacturing procedure. In addition, in some embodiments, an auxiliary electrode accommodating portion in a position of the pixel defining layer provides a smooth contact surface or a planar surface of the second electrode and the auxiliary electrode, which can facilitate manufacturing of the subsequent barrier layer or the thin film packaging.

The present disclosure is described hereinabove taking a top emitting type OLED display device as an example.

However, the scope of the present disclosure is not limited to this, and the OLED display device can be a bottom emitting type, and can be a transparent OLED display device and the like.

The above embodiments are described only for better understanding, rather than restricting, the present disclosure. Any person skilled in the art can make amendments to the implementing forms or details without departing from the spirit and scope of the present disclosure. The protection scope of the present disclosure shall be determined by the scope as defined in the claims.

The invention claimed is:

1. An OLED display unit, comprising:
a first electrode, provided on a planar layer near a substrate, made of a conductive metal with a high work function, the first electrode being a reflective electrode;
a light emitting material layer, provided on the first electrode, emitting light under an applied electric field to form an image display;
a second electrode, provided on the light emitting material layer, made of a conductive metal with a low work function, the second electrodes of respective display units being connected with each other when constituting a display device; and
an auxiliary electrode, provided below the second electrode, formed prior to the light emitting material layer, and connected with the second electrode to reduce impedance of the second electrode,
wherein a thin film transistor array, a data line and a scanning line are further arranged between the substrate and the planar layer;
wherein the auxiliary electrode includes a first auxiliary electrode and a second auxiliary electrode, the first auxiliary electrode is provided in a same layer as a gate of a thin film transistor, and the second auxiliary electrode is provided in a same layer as a source and/or a drain of the thin film transistor; and the first auxiliary electrode and the second auxiliary electrode both are bar-shaped electrodes, wherein long sides of the first auxiliary electrode are parallel to the scanning line and long sides of the second auxiliary electrode are parallel to the data line; and
wherein the second electrode is connected with the first auxiliary electrode and the second auxiliary electrode through a via hole.

2. The OLED display unit according to claim 1, wherein auxiliary electrodes arranged in a direction parallel to the data line and/or auxiliary electrodes arranged in a direction parallel to the scanning line are connected with each other and receive a same voltage signal as the second electrode.

3. The OLED display unit according to claim 1, wherein a pixel defining layer is further provided on the planar layer, an accommodating portion is formed on the pixel defining layer, and the auxiliary electrode is deposited in the accommodating portion.

* * * * *